US012813219B2

(12) United States Patent
Chaji

(10) Patent No.: US 12,813,219 B2
(45) Date of Patent: Nov. 24, 2026

(54) MICRODEVICE CARTRIDGE MAPPING AND COMPENSATION

(71) Applicant: VueReal Inc., Waterloo (CA)

(72) Inventor: Gholamreza Chaji, Waterloo (CA)

(73) Assignee: VueReal Inc., Waterloo (CA)

( * ) Notice: Subject to any disclaimer, the term of this patent is extended or adjusted under 35 U.S.C. 154(b) by 561 days.

(21) Appl. No.: 18/258,834

(22) PCT Filed: Dec. 30, 2021

(86) PCT No.: PCT/CA2021/051899

§ 371 (c)(1),
(2) Date: Jun. 22, 2023

(87) PCT Pub. No.: WO2022/140856

PCT Pub. Date: Jul. 7, 2022

(65) Prior Publication Data

US 2024/0047261 A1 Feb. 8, 2024

Related U.S. Application Data

(60) Provisional application No. 63/131,879, filed on Dec. 30, 2020.

(51) Int. Cl.
*H01L 21/77* (2017.01)
*H10P 72/70* (2026.01)

(52) U.S. Cl.
CPC .......... *H10P 72/74* (2026.01); *H10P 72/7432* (2026.01); *H10P 72/7434* (2026.01)

(58) Field of Classification Search
CPC ....... H01L 21/6835; H01L 2221/68363; H01L 2221/68368; H01L 25/167; H01L 25/0753; H10H 20/857; H10H 20/01; H10H 20/0364
USPC .......................................................... 438/107
See application file for complete search history.

(56) References Cited

U.S. PATENT DOCUMENTS

| | | | | |
|---|---|---|---|---|
| 5,110,388 | A * | 5/1992 | Komiyama | H01L 24/83 156/275.5 |
| 9,306,180 | B2 | 4/2016 | Kim | |
| 9,954,139 | B2 * | 4/2018 | Krause | H10F 77/122 |
| 10,008,405 | B2 * | 6/2018 | Iwanaga | H01L 21/68 |
| 10,008,610 | B2 * | 6/2018 | Park | H01L 25/0753 |
| 10,050,026 | B2 * | 8/2018 | Takeya | H01L 25/167 |
| 10,886,158 | B2 * | 1/2021 | Benaissa | H10K 71/18 |
| 11,355,548 | B2 * | 6/2022 | Hin | H10H 29/142 |

(Continued)

FOREIGN PATENT DOCUMENTS

| | | | |
|---|---|---|---|
| KR | 102172349 | B1 | 10/2020 |
| KR | 20210113009 | A | 9/2021 |

OTHER PUBLICATIONS

WIPO: PCT International Search Report and Written Opinion relating to PCT application No. PCT/CA2021/051899, dated Mar. 22, 2022.

*Primary Examiner* — Vu A Vu

(57) ABSTRACT

This disclosure is related to transfer of microdevices from a donor substrate to a system or temporary substrate where a pitch between microdevices is adjusted by stretching the substrate before or after the transfer. Further, methods are disclosed to protect the electronic components by use of stretchable pillars and grooves. In addition, a sandwich configuration with a sheeting process is also considered.

11 Claims, 6 Drawing Sheets

(56) References Cited

U.S. PATENT DOCUMENTS

| | | | | |
|---|---|---|---|---|
| 11,551,986 | B2 * | 1/2023 | Kummerl | H10P 54/00 |
| 11,996,395 | B2 * | 5/2024 | Choi | H10H 29/10 |
| 2006/0169989 | A1 | 8/2006 | Bhattacharya et al. | |
| 2013/0133822 | A1 | 5/2013 | Koetse et al. | |
| 2016/0111604 | A1 * | 4/2016 | Li | H01L 24/95 438/107 |
| 2019/0096774 | A1 | 3/2019 | Chaji | |
| 2020/0137201 | A1 | 4/2020 | Chopra et al. | |

* cited by examiner

MICRODEVICE CARTRIDGE MAPPING AND COMPENSATION

BACKGROUND AND FIELD OF THE INVENTION

The present disclosure relates to the compensation of microdevices based on cartridge information. In particular, the disclosure relates to a process to a microdevice transfer.

BRIEF SUMMARY

According to one embodiment disclosed by the invention there is a method to transfer microdevices from a donor substrate to a system substrate, having an original microdevice pitch in the donor substrate smaller than a final pixel pitch in system substrate, and adjusting a pitch difference between the donor substrate and system substrate prior to the transfer to increase a number of microdevices transferred from the donor substrate to the system substrate.

According to another embodiment disclosed by the invention there is a method to transfer microdevices from a donor substrate to a system substrate, wherein the system substrate has a smaller pixel pitch than a final pitch and the pixel pitch in the system substrate is increased after the transfer to match the final pitch.

According to another embodiment disclosed by the invention there is a method of adjusting microdevice pitch in a substrate by stretching where the microdevices are on a pillar. In one case the substrate is a system substrate.

According to another embodiment disclosed by the invention there is a method to transfer microdevices, having a pitch for microdevices in a donor substrate, having the pitch in the donor substrate that is smaller than a pitch in a system substrate, and selectively transferring a number of microdevices from the donor substrate to the system substrate in more than one transfer cycle.

According to another embodiment disclosed by the invention there is a method to transfer microdevices, transferring microdevices into a temporary or a system substrate, and adjusting the pitch of the microdevices in the temporary or the system substrate, by stretching the substrate.

According to another embodiment disclosed by the invention there is a method to transfer microdevices, adjusting at least one pitch for microdevices in a donor substrate by stretching, bringing the pitch closer to at least a corresponding pitch in a system substrate, and transferring all microdevices in one transfer to the system substrate.

According to another embodiment disclosed by the invention there is a method to transfer microdevices, having pillars on the donor substrate where microdevices sit on the pillars, adjusting a pitch of the microdevices in the donor substrate by stretching the donor substrate prior to transferring microdevices to a system substrate, reducing the impact of stretching on the microdevices through the pillar, and transferring a set of microdevices with the to the system substrate.

According to another embodiment disclosed by the invention there is a method to transfer microdevices, having pillars on the substrate where microdevices sit on the pillars, having a groove structure underneath the pillars to enable a stretching of the substrate, and adjusting a pitch of the microdevices in the substrate by stretching the substrate.

According to another embodiment disclosed by the invention there is a method to transfer microdevices, having microdevices sandwiched between two layers, and stretching the two layers to increase a pitch of the microdevices.

BRIEF DESCRIPTION OF THE DRAWINGS

The foregoing and other advantages of the disclosure will become apparent upon reading the following detailed description and upon reference to the drawings.

Figure 1:
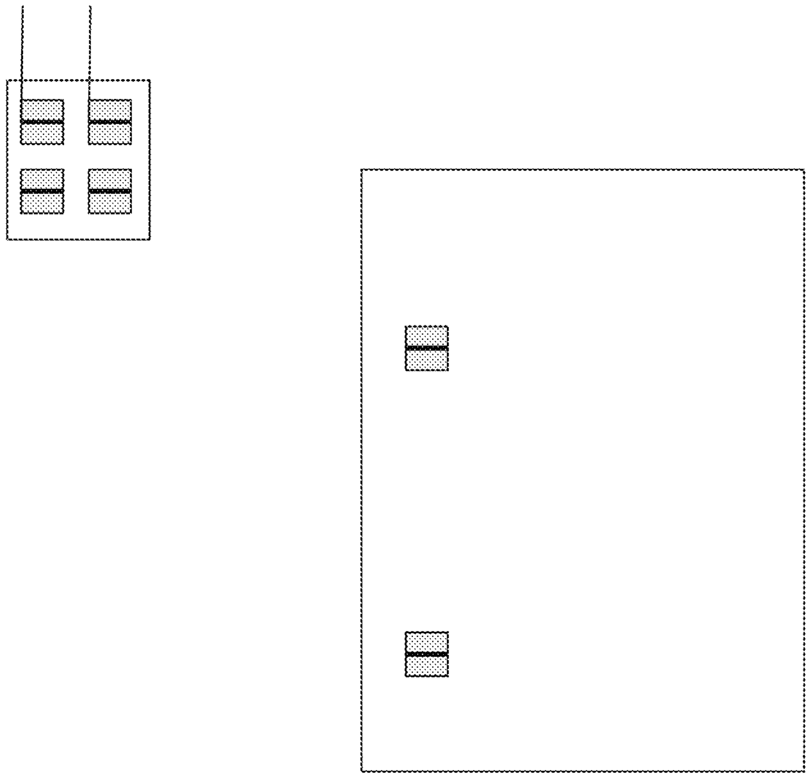
FIG. 1 shows the microdevice pitch in a donor substrate and a system substrate.

The present disclosure is susceptible to various modifications and alternative forms, specific embodiments or implementations as have been shown by way of example in the drawings and will be described in detail herein. It should be understood, however, that the disclosure is not intended to be limited to the particular forms disclosed. Rather, the disclosure is to cover all modifications, equivalents, and alternatives falling within the spirit and scope of an invention as defined by the appended claims.

DETAILED DESCRIPTION

FIG. 1 shows the microdevice 102 pitch in a donor substrate 100 and a system substrate 104. The microdevice 102 pitch (dp) is smaller than the pitch (pp) in the system substrate 104. Thus there is a need to increase the pitch (dp) of the microdevice 102 to match the pitch (pp) of the system substrate 104. In one approach, the microdevices 102 are selectively transferred from a donor substrate 100 into the system substrate 104; if the microdevice 106 pitch in the system substrate is pp (representing distance between two consecutive devices in the system substrate) and the device pitch in the donor is dp (representing distance between two consecutive devices in the donor substrate of) only one from every ~(pp/dp)^2 array of microdevices is transferred into the system substrate. For example, in case the pitch of devices is 10 um in donor substrate and the pitch of devices in the system substrate is 400 um in system substrate, only one device from an array of 40×40 devices in donor substrate is transferred at a time. Furthermore, the size of the donor substrate is much smaller than the system substrate. For example, a 88 inch TV can be around 200×110 cm2. Assuming the donor substrate is 2×2 cm, the number transfer cycle will be 5500. However, if one can reduce the pitch and size of system substrate during transfer, the number of transfer cycles will reduce significantly and the number of microdevices transferred per cycle will increase as well.

In one case, the donor substrate is stretched to increase the distance between microdevices before a transfer to a system substrate. In this case the donor substrate is stretched to increase the distance (pitch) between microdevices to a predetermined amount to match the system substrate so that the microdevices are transferred in one transfer. In another related case, the system substrate has a smaller distance between microdevices. After the microdevices are transferred into the system substrate, the substrate can get stretched to match a final predetermined microdevice distance.

Figure 2:
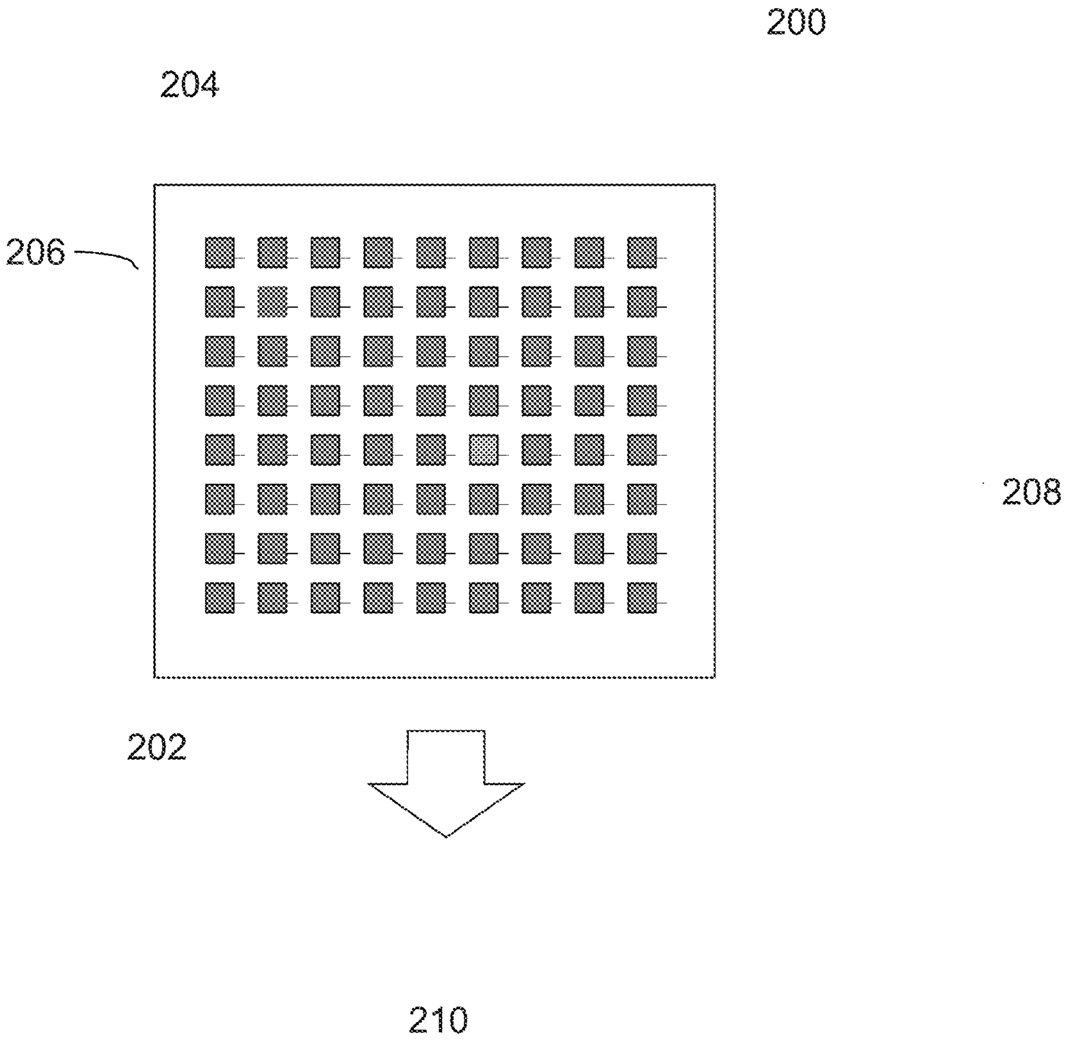
FIG. 2 shows another embodiment to adjust the pitch between microdevices in a substrate.

FIG. 2 shows an embodiment to adjust the pitches 204 and 206 between microdevices 202 in a substrate 200. The substrate 200 can be the donor or the system/temporal substrate after microdevices are transferred into it. The stretching process explained here can be applied to either of the temporary, system or donor substrate although only one type is used to explain. Here, the substrate 200 is stretched (or extended) in at least one direction 208 or 210. As a result, the original pitch of microdevices in the system substrate can be closer to the pitch in the donor substrate leading to transferring more devices at once and reducing the number of transfers. The substrate 200 can be the donor substrate, system substrate or a temporary substrate. After the substrate 200 is stretched (or extended) it can be laminated to another substrate to hold the stretch or extension permanently. In another case when substrate 200 is a temporary substrate, the microdevices 202 from the substrate 200 can be transferred to the system substrate after the stretching. In another related case, if substrate 200 is a temporary substrate, it can be laminated to a system substrate. In another case, the stretching or extension process may be repeated a few times to increase the original pitch between microdevices. Here, after the first stretch process, the microdevices are attached to another substrate and the second substrate is stretched or extended. A few cycles of transfers to a temporary substrate may be needed before a final transfer to the system substrate when the microdevice distance can match the dimensions of the system substrate as needed for the final transfer. While one can stretch the system substrate, using a donor or temporary substrate to stretch is more practical as the system substrate may have other components (such as transistors, electrodes, etc.) as well. Furthermore, stretching for a temporary substrate enables multiple cycles of stretching. Here, the first temporary substrate (or donor substrate) is stretched to some extent. The microdevices are then transferred to another temporary substrate (or system substrate) and the new substrate is stretched furthermore. This process can be repeated till the pitch of the microdevices is within the margin set for the system substrate or transfer process. This process reduces the stress on and breakdown of substrates during the stretching. More importantly, as the material experiences smaller deformation during each cycle, the non-idealities are minimized and the devices stay intact and the stretching becomes more uniform.

Figure 3A:
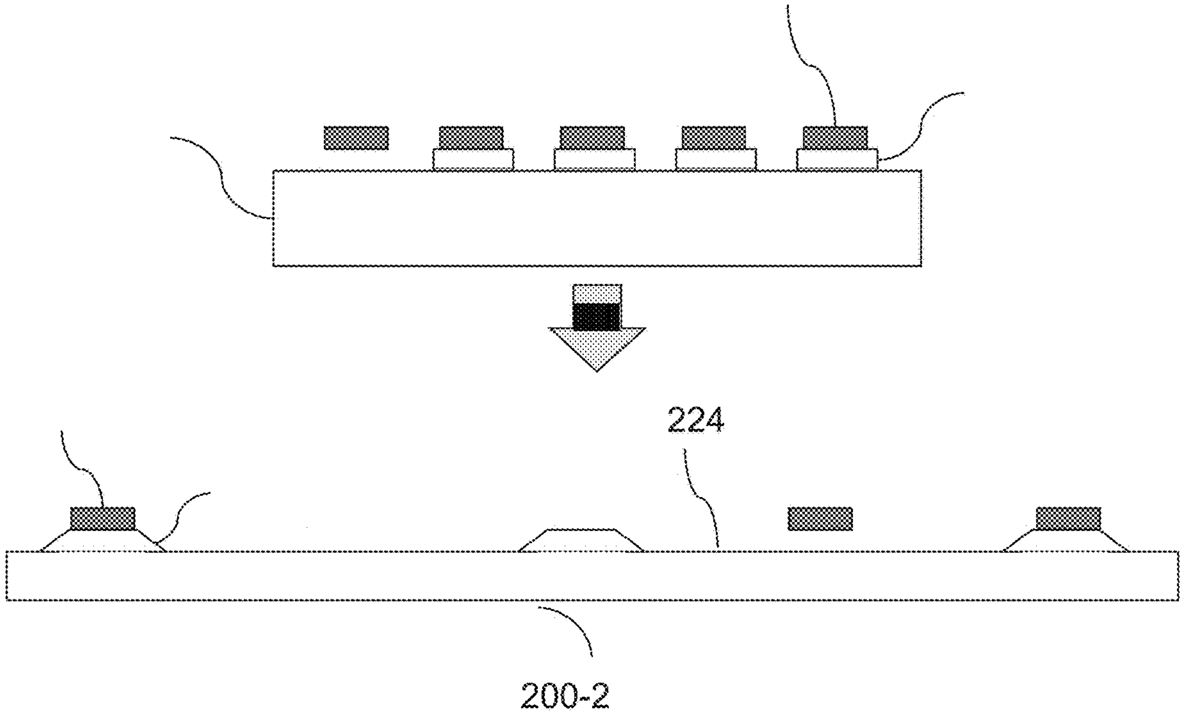
FIG. 3A shows the microdevices are on top of pillars.

The main challenge for stretching the substrate is the area underneath the microdevice 202. If that area is stretched, it can cause damage or loss of microdevices. If the bonding of microdevice 202 to substrate 200 does not allow the stretch of the area, it can cause non-uniform stretching or limited stretching. In one solution demonstrated in FIG. 3A, the microdevices 202 are on top of pillar 220. The pillars 220 can be smaller than microdevices 202. The height of the pillar 220 depends on the stretch ratio 230. As a result, the stretching of the surface will propagate through the pillar 220 at a smaller ratio. After the transfer, the pillar 222 can be shorter at the same time that the pitch 224 increased. Also, the substrate 200 becomes thinner 200-2 after stretching.

Figure 3B:
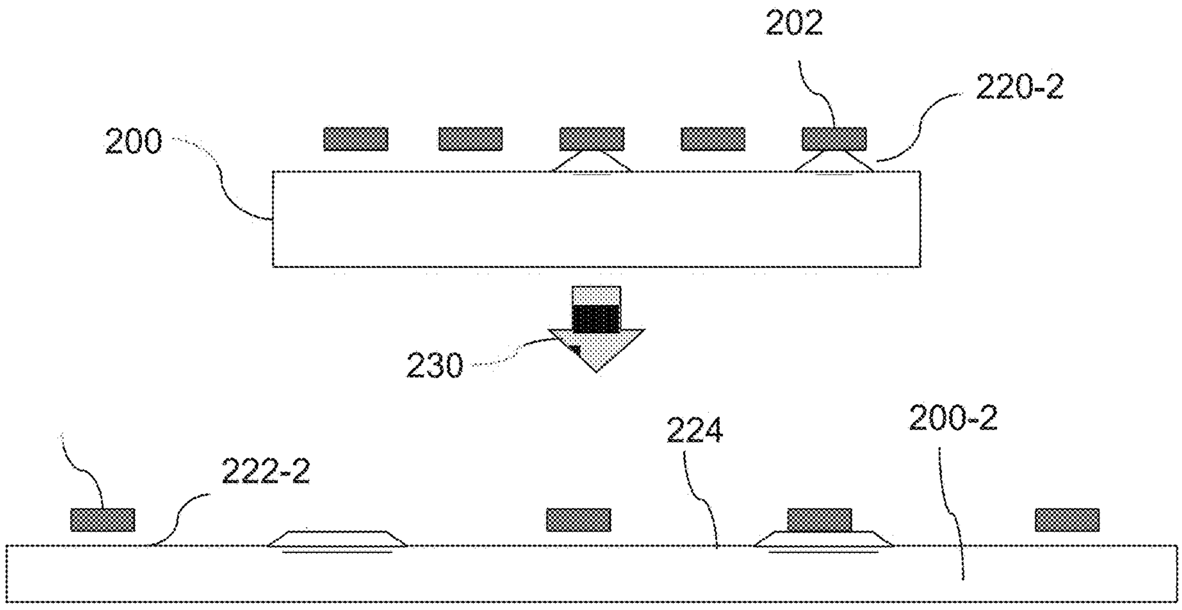
FIG. 3B shows the pillars are shaped to assist the stretching without damaging the microdevices.

FIG. 3B shows another related embodiment where the pillars 220-2 are shaped to assist the stretching without damaging the microdevices 202. The pillar 220 can be formed by depositing some materials on the surface of a substrate 200. In another case, it can be formed by changing the substrate profile of the substrate 200 by either etching, stamping, or pressing. After stretching, the pillars 220-2 are transformed as 222-2.

Figure 3C:
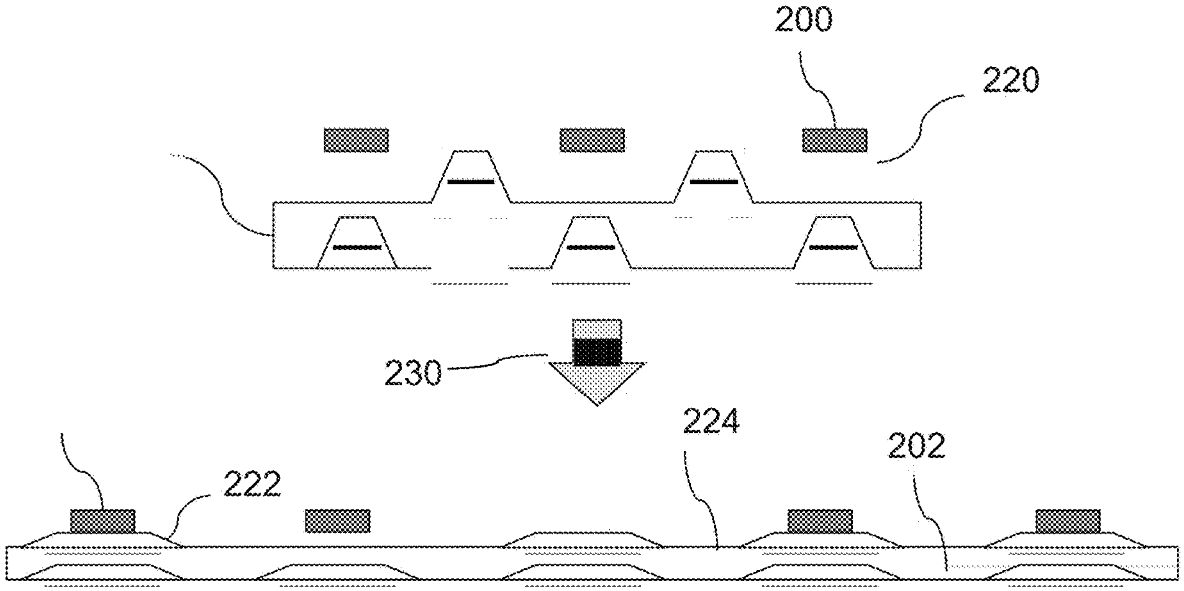
FIG. 3C shows the substrate has the same pillar and grooves.

FIG. 3C shows another related embodiment where the substrate 200 has the same pillar 220 and grooves. The structure with pillars and grooves can be formed after the transfer of microdevices into the substrate 200 or it can be done prior to the transfer. The structure can be formed by etching, stamping, or molding. The grooves or pillars can be in one dimension or both dimensions. In the case of one dimension, the substrate can increase the pitch of the microdevice in one direction. After the stretching (or extension), the microdevices can be transferred to another substrate that has grooves in a different dimension of the first substrate.

Embodiments in Combination of FIGS. 1-3

According to one embodiment disclosed by the invention there is a method to transfer microdevices from a donor substrate to a system substrate, having an original microdevice pitch in the donor substrate smaller than a final pixel pitch in system substrate, and adjusting a pitch difference between the donor substrate and system substrate prior to the transfer to increase a number of microdevices transferred from the donor substrate to the system substrate. In one case the microdevice pitch in the donor substrate can be increased by stretching before the transfer. In another case, the microdevices may be transferred to a temporary substrate first and the temporary substrate is stretched. Here the process of transferring to the temporary substrate and stretching process may be repeated till a final transfer to the system substrate. In another case, the pixel pitch increases by stretching to a final pitch after the microdevices are transferred into the system substrate.

According to another embodiment disclosed by the invention there is a method to transfer microdevices from a donor substrate to a system substrate, wherein the system substrate has a smaller pixel pitch than a final pitch and the pixel pitch in the system substrate is increased after the transfer to match the final pitch.

According to another embodiment disclosed by the invention there is a method of adjusting microdevice pitch in a substrate by stretching where the microdevices are on a pillar. In one case the substrate is a system substrate. In another case, the substrate is a donor or a temporary substrate. In another case, there is a groove structure formed underneath the pillar.

According to another embodiment disclosed by the invention there is a method to transfer microdevices, having a pitch for microdevices in a donor substrate, having the pitch in the donor substrate that is smaller than a pitch in a system substrate, and selectively transferring a number of microdevices from the donor substrate to the system substrate in more than one transfer cycle. In one case, reducing the pitch in the system substrate reduces a number of transfer cycles and increases the number of microdevices transferred per transfer cycle. In another case, increasing the pitch in the donor substrate reduces a number of transfer cycles and increases the number of microdevices transferred per transfer cycle.

According to another embodiment disclosed by the invention there is a method to transfer microdevices, transferring microdevices into a temporary or a system substrate, and adjusting a pitch of the microdevices in the temporary or the system substrate, by stretching the substrate. In one case, the system substrate can be laminated to another substrate while in a stretched state to hold the stretch permanently. In another case, the stretching is repeated more than once to increase an original pitch between microdevices and after a first stretch process, the microdevices are attached to another substrate which may be stretched to increase the pitch between microdevices. Here, the stretching can be repeated for each subsequent temporary substrate till a final stretched pitch of the microdevices is within a margin set for the system substrate and the system substrate may be laminated to another substrate while in a stretched state to hold the stretch permanently after a final transfer.

According to another embodiment disclosed by the invention there a method to transfer microdevices, adjusting at least one pitch for microdevices in a donor substrate by stretching, bringing the pitch closer to at least a corresponding pitch in a system substrate, and transferring all microdevices in one transfer to the system substrate.

According to another embodiment disclosed by the invention there is a method to transfer microdevices, having pillars on the donor substrate where microdevices sit on the pillars, adjusting a pitch of the microdevices in the donor substrate by stretching the donor substrate prior to transferring microdevices to a system substrate, reducing the impact of stretching on the microdevices through the pillar, and transferring a set of microdevices with the to the system substrate. In one case, the height of the pillar is a function of stretching ratio. In another case, the pillar can be of the same material as donor substrate. In another case, the pillars may be formed by depositing material on the substrate and are shaped to assist the stretch by not stretching the area underneath the microdevices. In another case, the pillars may be formed by changing the donor substrate profile by etching, stamping or pressing and can be shaped to assist the stretch by not stretching the area underneath the microdevices.

According to another embodiment disclosed by the invention there is a method to transfer microdevices, having pillars on the substrate where microdevices sit on the pillars, having a groove structure underneath the pillars to enable a stretching of the substrate, and adjusting a pitch of the microdevices in the substrate by stretching the substrate. In one case, the pillars and grooves may be formed by etching, stamping, or molding. In another case, the pillars and grooves are formed before or after a transfer in a respective substrate. Here, the pillars and grooves can be in one or two dimensions and in case of one dimension, stretching increases the pitch in one dimension. Further, the microdevices can be transferred to another substrate with grooves in a different dimension.

Figure 4A:
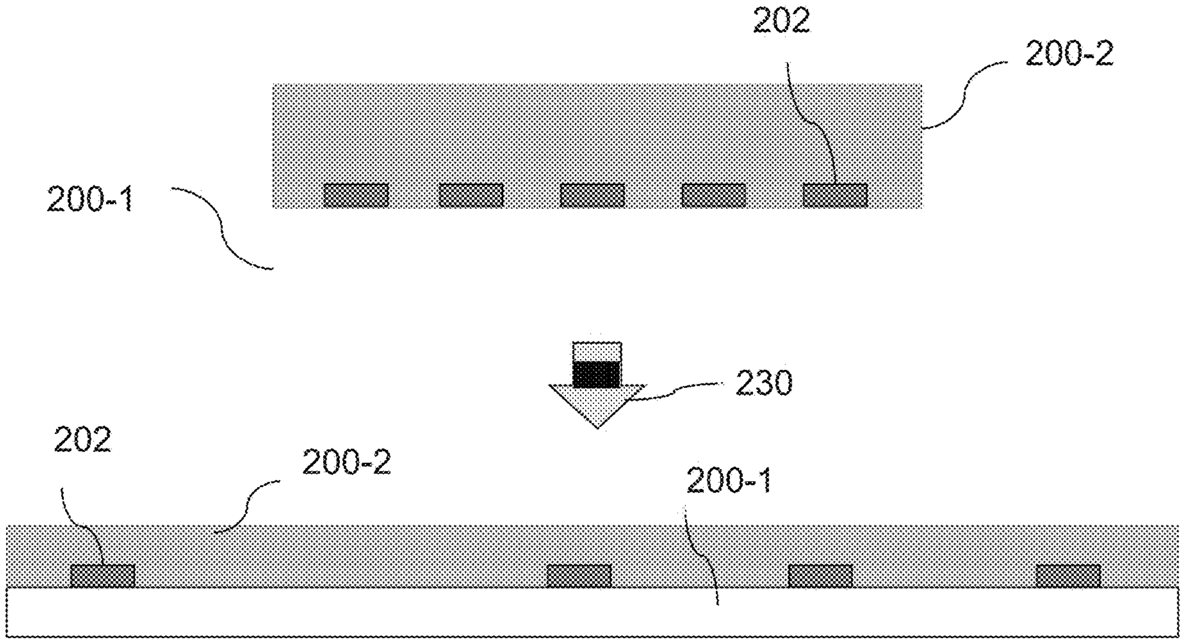
FIG. 4A shows the microdevices are sandwiched between two layers.

FIG. 4A shows another related embodiment where the microdevices 202 are sandwiched between two protection layers 200-1 and 200-2 and as a result stretching the two layers 200-1 and 200-2 can protect the microdevices 202. In another case, one of the layers 200-1 or 200-2 can be patterned to protect the microdevice.

Figure 4B:
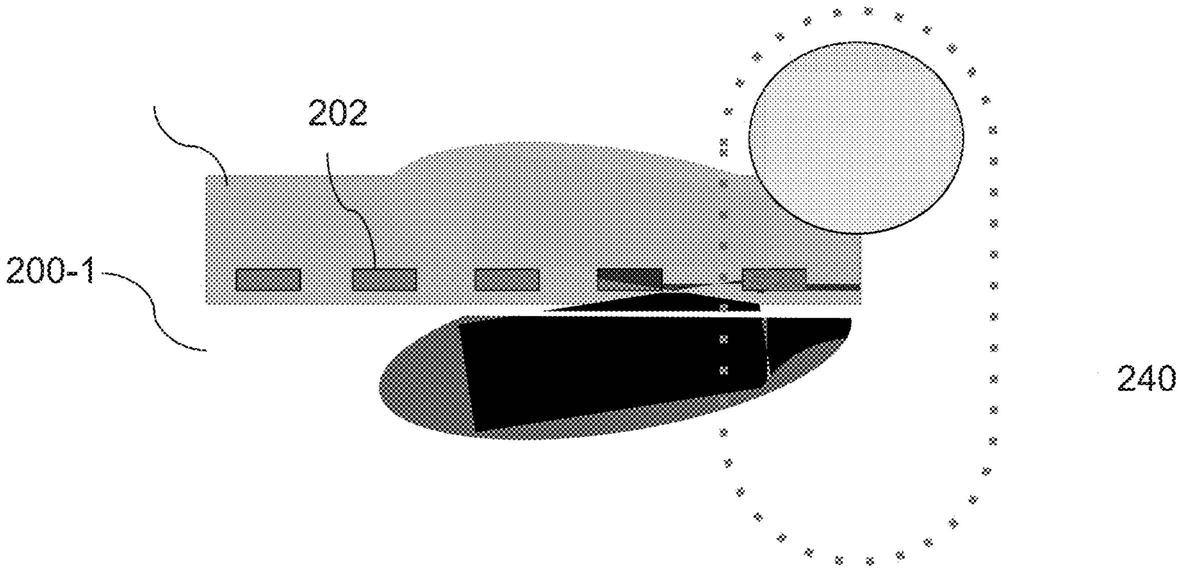
FIG. 4B shows an embodiment where the two can be extended using a sheeting process.

FIG. 4B shows an embodiment where the two layers 200-1 and 200-2 can be extended using a sheeting process. Here, the microdevices 202 are embedded between two layers to pass through a sheeting roll setup 240 and therefore the substrate layers 200-1 and 200-2 extend and the pitch of the microdevices 202 increases.

Figure 4C:
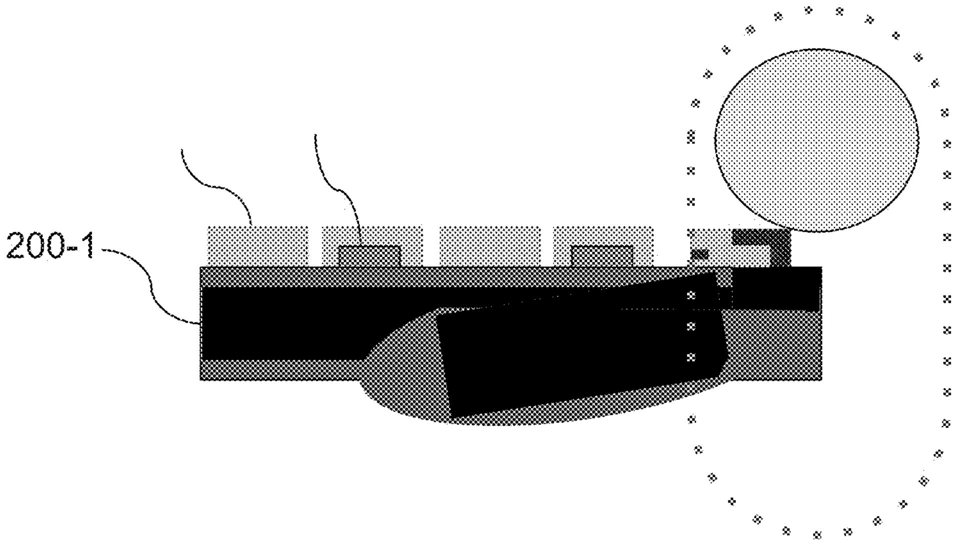
FIG. 4C shows the microdevices are on the surface of a substrate layer.

FIG. 4C shows another related embodiment where the microdevices are on the surface of a substrate layer 200-1 and protected by another layer 200-2 covering the devices.

The invention being thus described, it will be obvious that the same may be varied in many ways. Such variations are not to be regarded as a departure from the scope of the invention, and all such modifications as would be obvious to one skilled in the art are intended to be included within the scope of the following claims.

What is claimed is:

1. A method to transfer microdevices from a donor substrate to a system substrate, the method comprising:
- having an original microdevice pitch in the donor substrate smaller than a final pixel pitch in system substrate; and
- adjusting a pitch difference between the donor substrate and system substrate prior to the transfer to increase a number of microdevices transferred from the donor substrate to the system substrate, wherein the system substrate is laminated to another substrate while in a stretched state to hold the stretch permanently.

2. The method of claim 1, wherein the microdevice pitch in the donor substrate is increased by stretching before the transfer.

3. The method of claim 2, wherein the microdevices are transferred to a temporary substrate first and the temporary substrate is stretched.

4. The method of claim 3, wherein the process of transferring to the temporary substrate and stretching process is repeated till a final transfer to the system substrate.

5. The method of claim 1, wherein the pixel pitch increases by stretching to a final pitch after the microdevices are transferred into the system substrate.

6. A method to transfer microdevices, the method comprising:
- having a pitch for microdevices in a donor substrate;
- having the pitch in the donor substrate that is smaller than a pitch in a system substrate; and
- selectively transferring a number of microdevices from the donor substrate to the system substrate in more than one transfer cycle, wherein the system substrate is laminated to another substrate while in a stretched state to hold the stretch permanently.

7. The method of claim 6, wherein reducing the pitch in the system substrate reduces a number of transfer cycles and increases the number of microdevices transferred per transfer cycle.

8. The method of claim 6, wherein increasing the pitch in the donor substrate reduces a number of transfer cycles and increases the number of microdevices transferred per transfer cycle.

9. A method to transfer microdevices, the method comprising:
- transferring microdevices into a temporary or a system substrate; and
- adjusting a pitch of the microdevices in the temporary or the system substrate by stretching the substrate, wherein the system substrate is laminated to another substrate while in a stretched state to hold the stretch permanently, and wherein the stretching is repeated more than once to increase an original pitch between microdevices and after a first stretch process, the microdevices are attached to another substrate which is stretched to increase the pitch between microdevices.

10. The method of claim 9, wherein the stretching is repeated for each subsequent temporary substrate till a final stretched pitch of the microdevices is within a margin set for the system substrate.

11. The method of claim 10, wherein the system substrate is laminated to another substrate while in a stretched state to hold the stretch permanently after a final transfer.

* * * * *